United States Patent
Yokoyama et al.

[11] Patent Number: 5,831,299
[45] Date of Patent: Nov. 3, 1998

[54] THIN FERROELECTRIC FILM ELEMENT HAVING A MULTI-LAYERED THIN FERROELECTRIC FILM AND METHOD FOR MANUFACTURING THE SAME

[75] Inventors: Seiichi Yokoyama; Yasuyuki Ito; Maho Ushikubo, all of Kashiwa; Masayoshi Koba, Nara, all of Japan

[73] Assignee: Sharp Kabushiki Kaisha, Osaka, Japan

[21] Appl. No.: 816,795

[22] Filed: Mar. 19, 1997

[30] Foreign Application Priority Data

Mar. 19, 1996 [JP] Japan .................................... 8-062538

[51] Int. Cl.$^6$ ...................................................... H01L 29/72
[52] U.S. Cl. ............................................................. 257/295
[58] Field of Search ............................................... 257/295

[56] References Cited

U.S. PATENT DOCUMENTS

| | | | |
|---|---|---|---|
| 5,077,270 | 12/1991 | Takeda et al. ........................... | 505/237 |
| 5,146,299 | 9/1992 | Lampe et al. ............................ | 257/295 |
| 5,331,187 | 7/1994 | Ogawa .................................... | 257/295 |
| 5,519,566 | 5/1996 | Perino et al. ............................ | 257/295 |
| 5,524,092 | 6/1996 | Park ......................................... | 365/145 |
| 5,548,475 | 8/1996 | Ushikubo et al. ...................... | 361/321.4 |
| 5,561,307 | 10/1996 | Mihara et al. .......................... | 257/295 |
| 5,567,979 | 10/1996 | Nashimoto et al. .................... | 257/295 |
| 5,576,564 | 11/1996 | Satoh et al. ............................. | 257/295 |
| 5,625,529 | 4/1997 | Lee et al. ................................ | 257/295 |

FOREIGN PATENT DOCUMENTS

PCT/US92/10542 12/1992 WIPO.
PCT/US93/10021 10/1993 WIPO.

OTHER PUBLICATIONS

"A New Group of Ferroelectrics", G. A. Smolenskii, et al. Soviet Phys. Solid State, 1959 p. 149.
"A Family of Ferroelectric Bismuth Compounds", by E. C. Subbarao, J. Phys. Chem. Solids, vol. 23, pp. 665–676.

*Primary Examiner*—Edward Wojciechowicz
*Attorney, Agent, or Firm*—Birch, Stewart, Kolasch & Birch, LLP

[57] ABSTRACT

A thin ferroelectric film element comprises upper and lower thin electrode films and a thin ferroelectric film formed on a substrate, wherein the thin ferroelectric film comprises at least three layers in which at least one layer has a composition of constituent elements different from those of the other layers and a resistivity higher than that of the other layers, and at least two layers of the others are the same composition of constituent element.

9 Claims, 13 Drawing Sheets

□ $SrBi_2Ta_{0.8}Nb_{1.2}O_9$ (SBTN)

● Present Invention
$SrBi_2Ta_2O_9/SrBi_2Ta_{0.8}Nb_{1.2}O_9/SrBi_2Ta_2O_9$
(SBT/SBTN/SBT)

○ $SrBi_2Ta_2O_9$ (SBT)

applied voltage [V]

☐ $SrBi_2Ta_{0.8}Nb_{1.2}O_9$ (SBTN)

● Present Invention
$SrBi_2Ta_2O_9/SrBi_2Ta_{0.8}Nb_{1.2}O_9/SrBi_2Ta_2O_9$
(SBT/SBTN/SBT)

○ $SrBi_2Ta_2O_9$ (SBT)

□ $SrBi_2Ta_{0.8}Nb_{1.2}O_9$ (SBTN)

● Present Invention
$SrBi_2Ta_2O_9/SrBi_2Ta_{0.8}Nb_{1.2}O_9/SrBi_2Ta_2O_9$
(SBT/SBTN/SBT)

○ $SrBi_2Ta_2O_9$ (SBT)

A: $SrBi_2Ta_2O_9$
B: $SrBi_2Ta_{0.8}Nb_{1.2}O_9$ thin film BBA thin film BAA thin film ABB thin film AAB thin film BAB thin film ABA thin film AAA thin film BBB

THIN FERROELECTRIC FILM ELEMENT HAVING A MULTI-LAYERED THIN FERROELECTRIC FILM AND METHOD FOR MANUFACTURING THE SAME

BACKGROUND OF THE INVENTION

1. Field of the Invention

The present invention relates to a thin ferroelectric film element and to a method for manufacturing the same. The thin ferroelectric film element of the present invention can be used for a memory element (e.g., a capacitor), a pyroelectric sensor (e.g., an infrared linear array sensor, a supersonic sensor), and a piezoelectric element (e.g., an optical modulator).

2. Description of the Related Arts

Thin ferroelectric films have numerous functions such as spontaneous polarization, high dielectric constant, electrooptical effect, piezoelectric effect and pyroelectric effect, and hence are applied to a wide range of device developments. For example, thin ferroelectric films are applied to infrared linear array sensors by utilizing their pyroelectricity, to supersonic sensors by utilizing their piezoelectricity, to optical modulators of a waveguide type by utilizing their electro-optical effect, and to capacitors for DRAMs and MMICs by utilizing their high dielectric constant.

Especially among these various application devices, there has been a development of ferroelectric non-volatile memories (FRAMs) that are highly dense and can operate at a high speed by combination with a semiconductor memory technique in accordance with the recent progress of thin film formation technique. Non-volatile memories incorporating a thin ferroelectric film are under extensive research and development for practical use not only as a replacement for conventional non-volatile memories but also as a memory that can be substituted for SRAMs and DRAMs owing to their properties such as high speed writing/reading, low-voltage operation, and high endurability in writing/reading.

In conducting these device developments, a material is required that has a large residual polarization (Pr), low coercive field (Ec), low leakage current, and endurability in repetition of polarization inversion. Further, it is preferable that the above properties are achieved with a thin film of 2000 Å or less so as to decrease the operation voltage and to conform to the fine processing of semiconductors.

Here, oxide materials having a perovskite structure such as PZT (lead titanate zirconate, $Pb(Ti_xZr_{1-x})O_3$) have been mainly used as ferroelectric materials for these purposes. However, in the case of a material such as PZT containing lead as its constituent element, lead tends to evaporate at the time of forming a film due to high vapor pressure of lead or its oxide, whereby defects or, in extreme cases, pinholes are generated in the formed film. This may increase the leakage current and, when the polarization inversion is repeated, this may cause a fatigue phenomenon in which the spontaneous polarization decreases. Particularly, in view of substituting ferroelectric non-volatile memories for FRAMs, it must be ensured, with respect to the fatigue phenomenon, that the characteristics remain unchanged even after $10^{15}$ times repetition of polarization inversion. Accordingly, the development of a thin ferroelectric film without a fatigue has been desired.

Meanwhile, a research and development of bismuth layered-structure compound materials has been recently taking place as a ferroelectric material for FRAMs. The bismuth layered-structure compound materials were found by Smolenskii and others in 1959 (G. A. Smolenskii, V. A. Isupov and A. I. Agranovskaya, Soviet Phys. Solid State, 1, 149(1959)), and were subsequently examined in detail by Subbarao (E. C. Subbarao, J. Phys. Chem. Solids, 23, 665(1962)). Recently, Carlos A. Paz de Araujo and others have found that thin films of bismuth layered-structure compound are suitable for application to integrated circuits of ferroelectrics and high dielectrics, and have reported an excellent fatigue property that the characteristics remain unchanged even after $10^{12}$ times repetition or more of polarization inversion (International Application No. PCT/US92/10542).

The bismuth layered-structure compound is selected from a compound of the formula $Bi_2A_{m-1}B_mO_{3m+3}$ (wherein A is selected from Na, K, Pb, Ca, Sr, Ba and Bi; and B is selected from Fe(III), Ti, Nb, Ta, W and Mo; and m is a positive integer). The crystal structure of the bismuth layered-structure compound is such that the $(Bi_2O_2)^{2+}$ layer and the $(A_{m-1}B_mO_{3m+1})^{2-}$ layer are alternately stacked. In other words, the basic crystal structure of the compound is such that the layered perovskite layer having a series of perovskite lattices of $(m-1)ABO_3$ is sandwiched from above and below by $(Bi_2O_2)^{2+}$ layers. Here, it is not always the case that the elements A and B to be selected are single elements.

Examples of such bismuth layered-structure compound materials include $SrBi_2Ta_2O_9$, $SrBi_2Nb_2O_9$, $Bi_4Ti_3O_{12}$, $BaBi_2Nb_2O_9$, $BaBi_2Ta_2O_9$, $PbBi_2Nb_2O_9$, $PbBi_2Ta_2O_9$, $SrBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Sr_2Bi_4Ti_5O_{18}$, $Ba_2Bi_2Ta_5O_{18}$, $Pb_2Bi_4Ti_5O_{18}$ and the like.

The method for manufacturing a thin ferroelectric film may be a physical method such as vacuum vapor deposition method, sputtering method and laser abrasion method, or a chemical method such as sol-gel method, MOD (Metal Organic Decomposition) method or MOCVD (Metal Organic Chemical Vapor Deposition) method employing thermal decomposition and oxidation of an organic metal compound used as a starting material to produce oxide ferroelectrics.

Among the above-mentioned methods for forming a ferroelectric film, the MOCVD method provides an excellent step-coverage and also may possibly be used for low temperature film formation, so that the MOCVD method is promising in view of manufacturing highly integrated FRAMs and has recently been under active research and development.

On the other hand, the sol-gel method or the MOD method has been widely used owing to the fact that a uniform mixture in an atomic level can be obtained, that the composition can be controlled easily and the reproducibility is excellent, that no special vacuum apparatus is required and a film having a large area can be formed under ordinary pressure and that the industrial cost is small.

Especially, the MOD method is used for forming the above-mentioned thin film of bismuth layered-structure compound, and a thin ferroelectric film or a thin dielectric film is manufactured through the following steps in the film formation process according to conventional MOD methods (International Application No. PCT/US92/10542, PCT/US93/10021).

(1) Step of applying a precursor solution containing a composite alkoxide and the like onto a substrate by spin coating method or the like for forming a film;

(2) Step of annealing and drying the obtained film at 150° C. for 30 seconds to several minutes for removing, from the film, the solvent and the alcohol and residual water that have been generated by the reaction of step (1);

(3) Step of annealing the film at 725° C. for 30 seconds under oxygen atmosphere by employing a RTA (Rapid Thermal Annealing) method for removing the organic components in the film by thermal decomposition; and (4) Step of annealing the film at 800° C. for one hour under oxygen atmosphere for crystallization of the film;

(5) Step of annealing the film at 800° C. for 30 minutes under oxygen atmosphere after an upper electrode is formed.

Here, in order for obtaining the desired film thickness, the steps of (1) to (3) are repeated and, finally, the steps of (4) and (5) are carried out.

The thin ferroelectric film or thin dielectric film is thus fabricated.

However, by a method of manufacturing a thin ferroelectric film using the above-mentioned conventional MOD method, little crystallization of the thin ferroelectric film takes place at annealing temperature of 650° C. or less. Accordingly, in order to obtain a high residual polarization, it is necessary to carry out an annealing step at an extremely high temperature of 800° C. for a period of time as long as one hour (International Application No. PCT/US93/10021). Therefore, in forming a thin ferroelectric film element on an integrated circuit having a stack structure, there will occur damages such as poor contact and deterioration in characteristics due to interdiffusion and oxidation between the viahole (contact hole) material and the electrode material, thus placing a hindrance particularly in manufacturing such highly integrated devices.

Also, since the annealing temperature is thus high, the particle diameter of the crystal particles constituting the thin ferroelectric film is as large as 1000 to 2000 Å and the irregularity on the surface of the thin film is large. Accordingly, it has not been possible to apply the conventional MOD method to fine submicron processing which is required in manufacturing highly integrated devices.

Moreover, in the case of highly integrated FRAMs of 4M bit to 16M bit or more, the capacitor area will be small and the spontaneous residual polarization Pr required in the ferroelectric materials will be large, so that Pr of at least 10 $\mu C/cm^2$ will be necessary. In the case of the thin $SrBi_2Ta_2O_9$ film, the spontaneous residual polarization Pr will be small in accordance with the decrease in the annealing temperature, so that it has not been possible to obtain sufficient Pr required in highly integrated FRAMs by conventional methods if the annealing temperature is lowered.

On the other hand, it is known in the art that Nb is added so as to increase Pr of the thin $SrBi_2Ta_2O_9$ film. However, if Nb is added into the thin $SrBi_2Ta_2O_9$ film, the coercive field Ec will be large although Pr will certainly be large. Accordingly, the leakage current will increase in addition to the rise in the operation voltage and, moreover, the fatigue characteristics will be deteriorated.

SUMMARY OF THE INVENTION

The present invention provides a thin ferroelectric film element comprising upper and lower thin electrode films and a thin ferroelectric film formed on a substrate, wherein the thin ferroelectric film comprises at least three layers in which at least one layer has a composition of constituent elements different from those of the other layers and a resistivity higher than that of the other layers, and at least two layers of the others are the same composition of constituent elements.

The present invention also provides a method of manufacturing the above-mentioned thin ferroelectric film element comprising: forming the lower thin electrode film on the substrate; applying each of a plurality of precursor solutions containing partially different metal elements and drying to form a laminate film of at least three layers comprising at least two kinds of films; performing a first annealing; forming the upper thin electrode film; and performing a second annealing.

Thus, the present invention provides a thin ferroelectric film element in which a sufficiently high spontaneous residual polarization and a sufficiently low coercive field are achieved at an annealing temperature lower than that by conventional methods, the thin ferroelectric film element being applicable to highly integrated FRAMs.

DETAILED DESCRIPTION OF THE PREFERRED EMBODIMENTS

Figure 1:
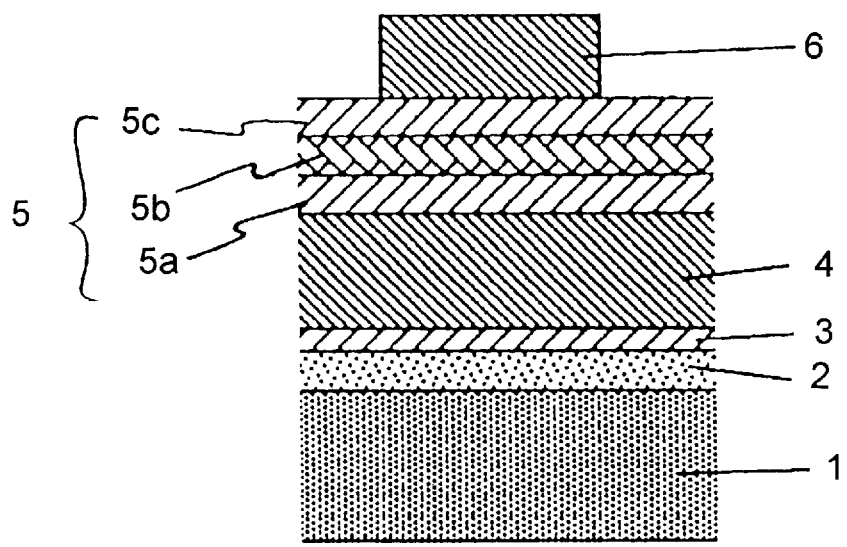
FIG. 1 is a schematic cross-sectional view showing an essential part of a thin ferroelectric film element according to Example 1 of the present invention.

The substrate to be used in the present invention is not specifically limited as long as it is a substrate (or wafer) on which a ferroelectric element, a semiconductor device including an integrated circuit and the like is generally formed. Preferable examples of the substrate include a semiconductor substrate such as silicon and a compound semiconductor substrate such as GaAs.

The thin ferroelectric film element of the present invention comprises upper and lower thin electrode films and a thin ferroelectric film formed on the substrate. The lower electrode film to be used in the present invention is not specifically limited as long as it is formed of an electrically conductive material that can be generally used as an electrode. Preferable examples of the lower electrode film include a monolayer film of a high melting-point metal such as Ta, Ti, W or a nitride thereof, Al, Cu, Pt, or an electrically conductive oxide such as $RuO_2$ or $IrO_2$, and a laminate film of these layers. The thickness of the lower thin electrode film to be formed may be, for example, about 500 Å to 2000 Å. The lower thin electrode film may be formed directly on a substrate or indirectly on a substrate on which a desired element or a circuit has been formed and further an interlayer insulating film or the like has been formed. However, the lower thin electrode film is preferably formed on the substrate through the intermediary of an insulating film such as $SiO_2$ or SiN.

The thin ferroelectric film to be formed on the thin electrode film is preferably formed of at least three layers. Among these layers, at least one layer has a different composition of constituent elements from that of the other layers and has a higher resistivity than other layers. Here, the term "different composition of constituent elements" includes both of the case in which the constituent elements of one layer are different from those of another layer and the case in which the constituent elements of one layer are the same as those of another layer but the composition ratio thereof is different. The thin ferroelectric film is preferably formed of a bismuth layered compound containing Sr, Bi, Ti, Ta and Nb having a high electropositivity such as SBT ($SrBi_2Ta_2O_9$), SBTN ($SrBi_2Ta_{0.8}Nb_{1.2}O_9$), BTO ($Bi_4Ti_3O_{12}$), $SrBi_4Ti_4O_{15}$, $SrBi_4(Ti, Zr)_4O_{15}$, $SrBi_2Nb_2O_9$, $CaBi_2Ta_2O_9$, $BaBi_2Ta_2O_9$, $BaBi_2Nb_2O_9$, $PbBi_2Ta_2O_9$, and the like, and further the above-mentioned bismuth layered-structure compound material. The material for at least one layer having the different composition of constituent elements from that of the other layers may be selected from the above compounds as long as the material has a resistivity higher than the resistivity of the other layers. The resistivity of at least one layer is preferably about $10^{12}$ Ω.cm or more, and the resistivity of the entire thin ferroelectric film is preferably within the range of about $10^{13}$ to about $10^{12}$ Ω.cm. It is preferable that each of the layers constituting the thin ferroelectric film has a thickness of about 100 Å to about 1000 Å. A layer having a thickness below about 100 Å will be stripe-like, making it difficult to form the layer. A layer having a thickness over about 1000 Å will generate cracks within the layer. The thickness of each layer may be the same or may be varied.

The thin ferroelectric film element according to the present invention preferably has a capacitor structure in which the upper thin electrode film similar to the above-mentioned lower thin electrode film is formed on the thin ferroelectric film. The shape and the size of the upper and lower electrodes to be formed may be suitably adjusted in accordance with the intended use or the like. The thin ferroelectric film element having such a structure may be applied to all kinds of semiconductor devices constituting the integrated circuits, for example, MFMIS-FETs, pyroelectric elements, ferroelectric cold cathode elements and the like.

The thin ferroelectric film according to the present invention may be formed by a physical method such as vacuum vapor deposition method, sputtering method and laser abrasion method, or by a chemical method such as sol-gel method, MOD method and MOCVD method using an organic metal compound as a starting material. Among these, a preferable method is a sol-gel method involving a series of steps including applying each of a plurality of precursor solutions containing partially different metal elements and drying to form a thin ferroelectric film of at least three layers comprising at least two kinds of thin ferroelectric films, performing a first annealing step, forming an upper thin electrode film, and performing a second annealing step.

More specifically described, preparation of precursor solutions for the thin ferroelectric film include: dissolving a starting material such as an alkoxide or a salt of each of the metals constituting the thin ferroelectric film into a suitable solvent, for example, an organic solvent such as hexane and 2-ethylhexanate; optionally heating to a temperature of about 100° to 120° C. for promoting the reaction; stirring the solution for about 1 to 60 minutes for mixing; and optionally heating and stirring the solution at a temperature of about 130° to 150° C. The obtained precursor solutions are preferably subjected to removal of the solvent, filtration and the like. The period of time for stirring or reacting the solutions or precursor solutions may be adjusted within the range of about 1 minute to 30 hours. Each of the precursor solutions thus synthesized is applied onto a substrate on which a lower thin electrode film has been formed. The precursor solutions may be applied by a conventional method such as spin coating method or the like. The thickness and the composition of each layer constituting the thin ferroelectric film can be controlled by adjusting the kind, the concentration, the viscosity and the like of the precursor solutions.

The applied precursor solutions are then dried. The drying is performed preferably through more than two steps. The first drying step may be carried out at a temperature of about 100° to about 130° C., preferably around 120° C., so as to ensure uniform drying. Drying at a temperature of more than 150° C. generates cracks by a film stress at the laminating step. The second drying step is preferably carried out at a temperature above the boiling point of the solvent, for example, about 250° to about 300° C.

The above steps are repeated more than three times to form a thin ferroelectric film of more than three layers.

Subsequently, a first annealing step is preferably performed after the thin ferroelectric film has been formed. The first annealing step is preferably carried out under an oxygen atmosphere or in an air at a temperature of about 500° to about 600° C. for about 1 to 60 minutes. The first annealing step may be carried out by employing a conventional method such as RTA method or heat treatment using a thermal processing furnace.

Then, the upper thin electrode film is formed. The upper thin electrode film may be formed of the above-mentioned electrically conductive material by employing a conventional method such as vacuum vapor deposition method, sputtering method, EB vapor deposition method or the like. A second annealing step is preferably performed after the upper thin electrode film has been formed. The second annealing step is preferably carried out under an oxygen atmosphere or in an air at a temperature of about 600° to 800° C. for about 1 to 60 minutes. The second annealing step may be carried out by employing a conventional method such as RTA method or heat treatment using a thermal processing furnace. By these annealing steps, it is possible to form a thin ferroelectric film which is dense and has good surface flatness.

EXAMPLES

The preferred embodiments of the present invention will hereafter be detailed in conjunction with the attached drawings. However, these embodiments are not to be construed as being intended to limit the scope of the present invention.

Example 1

FIG. 1 is a schematic cross-sectional view showing an essential part of a thin ferroelectric film element according to Example 1 of the present invention. Referring to FIG. 1, the thin ferroelectric film element has a capacitor structure including, in this order, a silicon single crystal substrate 1, a silicon thermal oxide film 2 of 200 nm thickness formed thereon, a Ta film 3 of 20 nm thickness formed thereon, a Pt film 4 of 200 nm thickness formed thereon, a thin ferroelectric film 5 of 200 nm thickness formed thereon, and an upper Pt electrode 6 of 100 nm thickness formed thereon. The thin ferroelectric film 5 includes a $SrBi_2Ta_2O_9$ layer 5a (hereafter referred to as SBT layer), a $SrBi_2Ta_{0.8}Nb_{1.2}O_9$ layer 5b (hereafter referred to as SBTN layer), and a $SrBi_2Ta_2O_9$ layer 5c (hereafter referred to as SBT layer) formed in this order.

Next, a method of manufacturing the thin ferroelectric film element shown in FIG. 1 will be explained.

First, a silicon thermal oxide film 2 is formed to a thickness of 200 nm on a (100) surface of the silicon single crystal substrate 1 by thermal oxidation of the surface of the silicon substrate 1 at 1000° C. A Ta film 3 is formed to a thickness of 20 nm on the silicon thermal oxide film 2 by sputtering method. A Pt film 4 is then formed to a thickness of 200 nm thereon. The obtained substrate is used as the substrate for forming the thin ferroelectric film.

Figure 2:
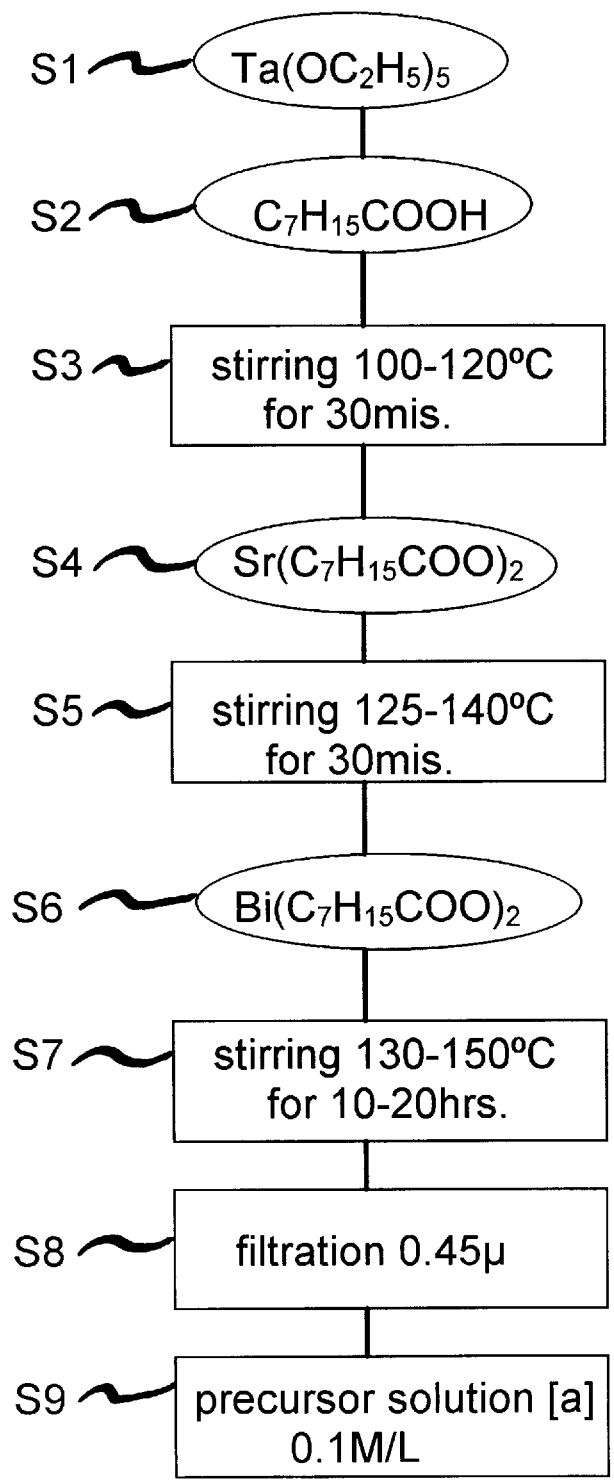
FIG. 2 is a diagram showing the steps of synthesizing a precursor solution (a) to be used for manufacturing the Example 1 of the present invention.
Figure 3:
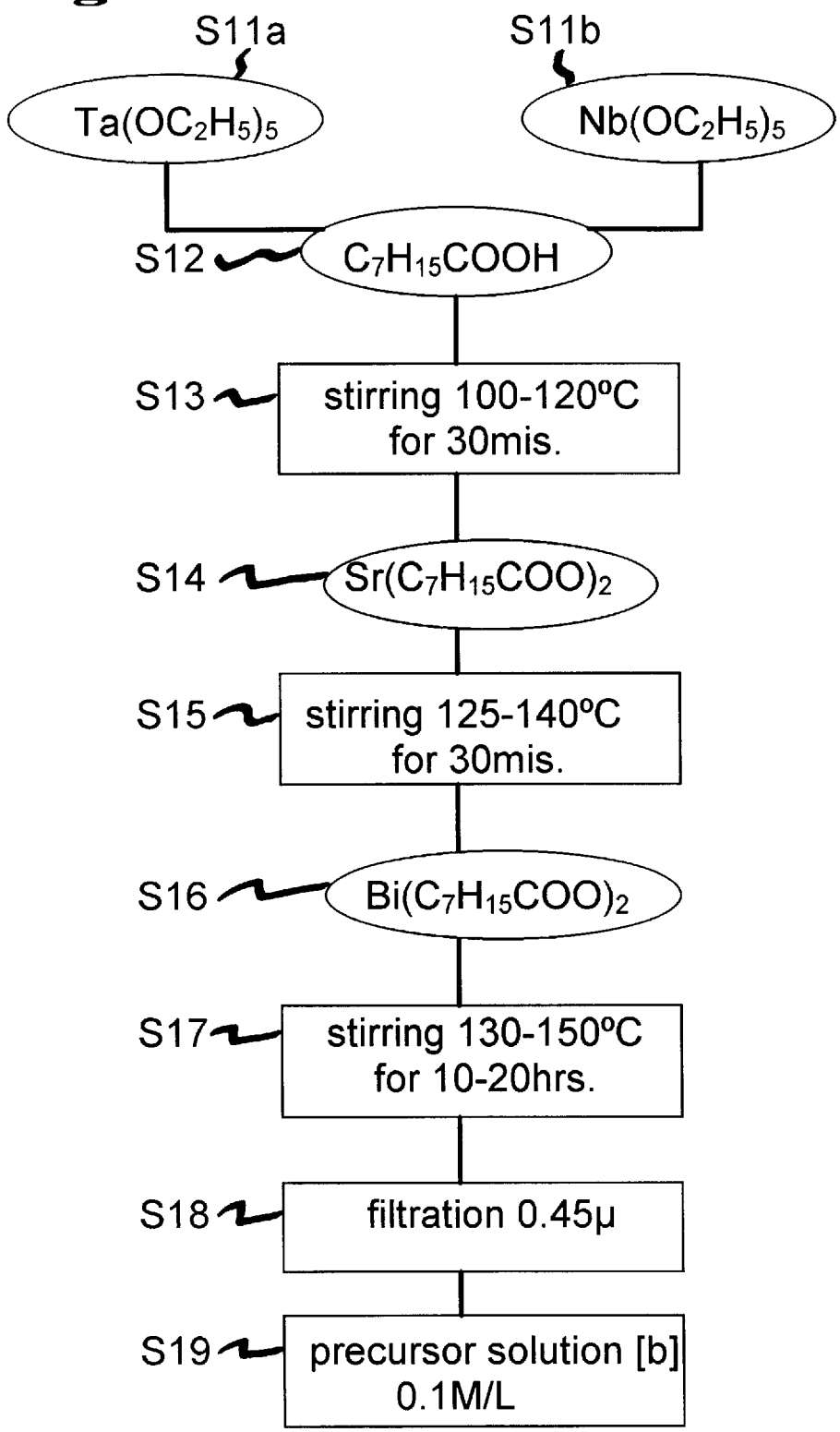
FIG. 3 is a diagram showing the steps of synthesizing a precursor solution (b) to be used for manufacturing the Example 1 of the present invention.

Precursor solutions to be used for forming the thin ferroelectric film 5 on the substrate were synthesized for sol-gel method in accordance with the process diagrams shown in FIGS. 2 and 3.

First, the synthesis of the precursor solution (a) to be used for forming the SBT layers 5a, 5c will be explained. Referring to FIG. 2, tantalum ethoxide was weighed (step S1) and dissolved in 2-ethylhexanate (step S2). In order to promote the reaction, the solution was stirred while being heated from 100° C. up to the maximum temperature of 120° C., and the reaction was continued for 30 minutes (step S3). Subsequently, ethanol and water generated in the reaction were removed at 120° C. Into the solution was added strontium-2-ethylhexanate dissolved in 20 ml to 30 ml of xylene (step S4), and the solution was heated and stirred from 125° C. up to the maximum temperature of 140° C. for 30 minutes (step S5). Into the solution was then added bismuth-2-ethylhexanate dissolved in 10 ml of xylene (step S6), and the solution was heated and stirred from 130° C. up to the maximum temperature of 150° C. for 10 hours (step S7).

The solution was then distilled at a temperature of 130° C. to 150° C. for 5 hours so as to remove the low molecular-weight alcohol, water and xylene used as a solvent from the solution. The solution was then filtrated with a filter of 0.45 $\mu$m diameter so as to remove dusts from the solution (step S8). Subsequently, the concentration of $SrBi_2Ta_2O_9$ in the solution was adjusted to 0.1 mol/l to produce the precursor solution (a) (step S9).

Next, the synthesis of the precursor solution (b) to be used for forming the SBTN layer 5b will be explained. Referring to FIG. 3, tantalum ethoxide and niobium ethoxide were weighed (steps S11a and S11b) and dissolved in 2-ethylhexanate (step S12). In order to promote the reaction, the solution was stirred while being heated from 100° C. up to the maximum temperature of 120° C., and the reaction was continued for 30 minutes (step S13). Subsequently, ethanol and water generated by the reaction were removed at 120° C. Into the solution was added strontium-2-ethylhexanate dissolved in 20 ml to 30 ml of xylene (step S14), and the solution was heated and stirred from 125° C. up to the maximum temperature of 140° C. for 30 minutes (step S15). Into the solution was then added bismuth-2-ethylhexanate dissolved in 10 ml of xylene (step S16), and the solution was heated and stirred from 130° C. up to the maximum temperature of 150° C. for 10 hours (step S17).

The solution was then distilled at a temperature of 130° C. to 150° C. for 5 hours so as to remove the low molecular-weight alcohol, water and xylene used as a solvent from the solution. The solution was then filtrated with a filter of 0.45 $\mu$m diameter so as to remove dusts from the solution (step S18). Subsequently, the concentration of $SrBi_2Ta_{0.8}Nb_{1.2}O_9$ in the solution was adjusted to 0.1 mol/l to produce the precursor solution (b) (step S19).

The above precursor solutions (a) and (b) were used to form a thin ferroelectric film having a three-layer laminated structure of SBT/SBTN/SBT on the substrate including the lower Pt electrode 4.

Figure 4:
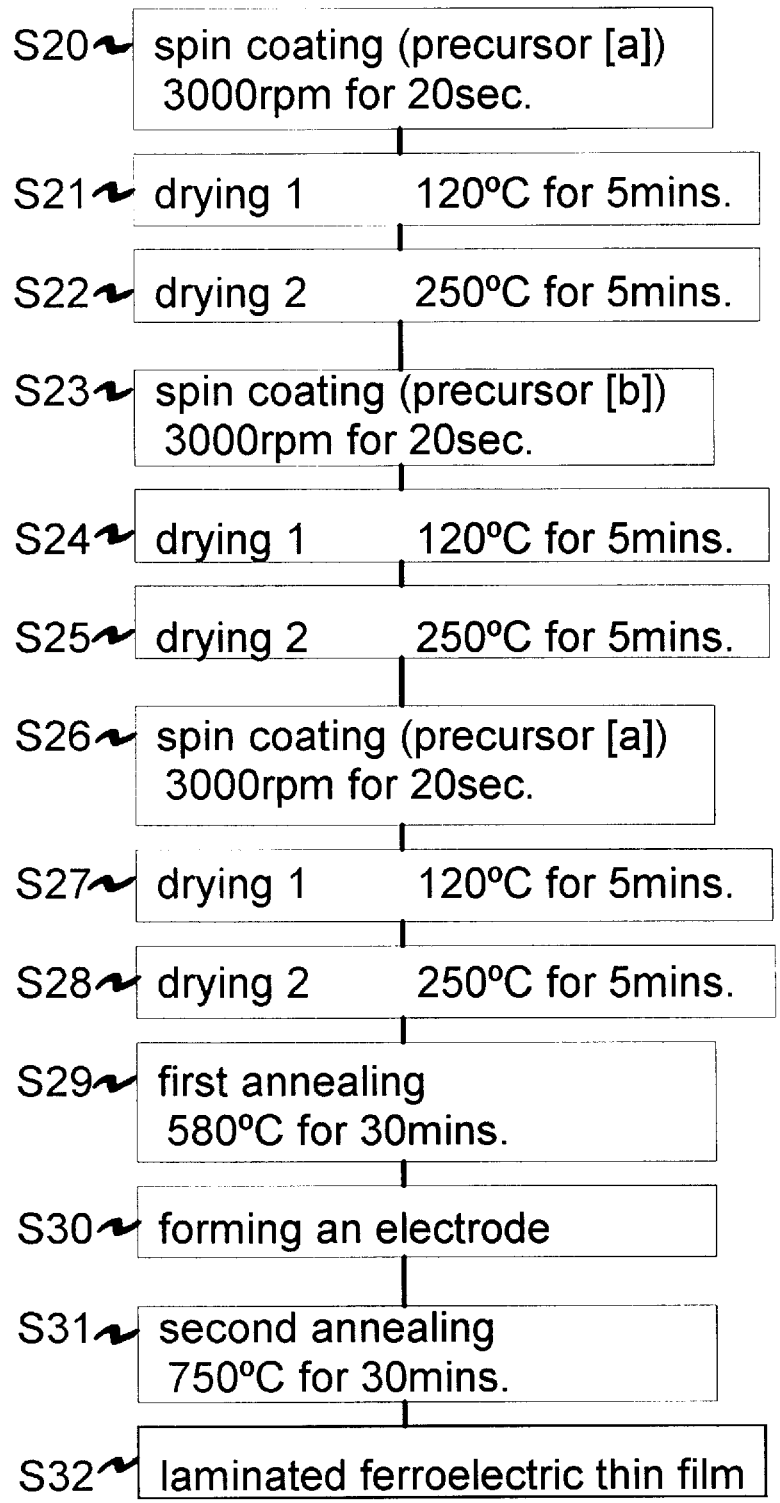
FIG. 4 is a diagram showing the manufacturing steps according to Example 1 of the present invention.

Referring to FIG. 4, the precursor solution (a) was drop-wise added onto the lower Pt electrode 4 for spin coating at 3000 rpm for 20 seconds (step S20). The substrate was then mounted on a hot plate heated to 120° C. and was baked and dried at 120° C. in an air for 5 minutes (step S21). Then, the wafer (substrate) was mounted on a hot plate heated to 250° C. and was baked and annealed in an air for 5 minutes so as to allow the solvent to be completely evaporated, thereby completing the SBT layer 5a (the first layer) (step S22).

Subsequently, the precursor solution (b) was dropwise added onto the SBT layer 5a (the first layer) for spin coating at 3000 rpm for 20 seconds (step S23). The substrate was then mounted on a hot plate heated to 120° C. and was baked and dried at 120° C. in an air for 5 minutes (step S24). Then, the wafer (substrate) was mounted on a hot plate heated to 250° C. and was baked and annealed in an ordinary air for 5 minutes so as to allow the solvent to be completely evaporated, thereby completing the SBTN layer 5b (the second layer) (step S25).

Subsequently, the precursor solution (a) was dropwise added onto the SBTN layer 5b (the second layer) for spin coating at 3000 rpm for 20 seconds (step S26). The substrate was then mounted on a hot plate heated to 120° C. and was baked and dried at 120° C. in an air for 5 minutes (step S27). Then, the wafer (substrate) was mounted on a hot plate heated to 250° C. and was baked and annealed in an air for 5 minutes so as to allow the solvent to be completely evaporated, thereby completing the SBT layer 5c (the third layer) (step S28).

A provisional annealing was then conducted in an oxygen atmosphere at 580° C. for 30 minutes as the first annealing by employing RTA (Rapid Thermal Annealing) method (step S29), and an upper Pt electrode 6 was deposited to a thickness of 150 nm using a mask by EB (Electron Beam) deposition method to form an electrode of 100 $\mu$m$\phi$ (step S30).

A main annealing was then conducted in an oxygen atmosphere at 750° C. for 30 minutes as the second annealing by employing RTA method (step S31).

The above steps completed the fabrication of the laminated thin ferroelectric film 5 including SBT layer 5a/SBTN layer 5b/SBT layer 5c each having a thickness of 67 nm and the total thickness being 200 nm (step S32).

The resistivity of the SBT film thus formed was $3.8 \times 10^{13}$ $\Omega$.cm and the resistivity of the SBTN film was $2.2 \times 10^{11}$ Ω.cm, so that the SBT film showed a larger resistivity than the SBTN film. The resistivity of the laminated thin ferroelectric film including the SBT layer/SBTN layer/SBT layer according to this embodiment was $3.3 \times 10^{13}$ Ω.cm.

Comparison Example 1

A thin ferroelectric film element including a single SBT layer of 200 nm was formed as the Comparison Example 1. The thin ferroelectric film was manufactured in the same manner (thermal processing temperature, element structure etc.) as in the Example 1 except that the steps of S20 to S22 of FIG. 4 were repeated three times using only the precursor solution (a) and the steps from S29 onward were subsequently performed.

Comparison Example 2

A thin ferroelectric film element including a single SBTN layer of 200 nm was formed as the Comparison Example 2. The thin ferroelectric film was manufactured in the same manner (thermal processing temperature, element structure etc.) as in the Example 1 except that the steps of S20 to S22 of FIG. 4 were repeated three times using only the precursor solution (b) and the steps from S29 onward were subsequently performed.

The ferroelectric properties of Example 1 and Comparison Examples 1 and 2.

Figure 5:
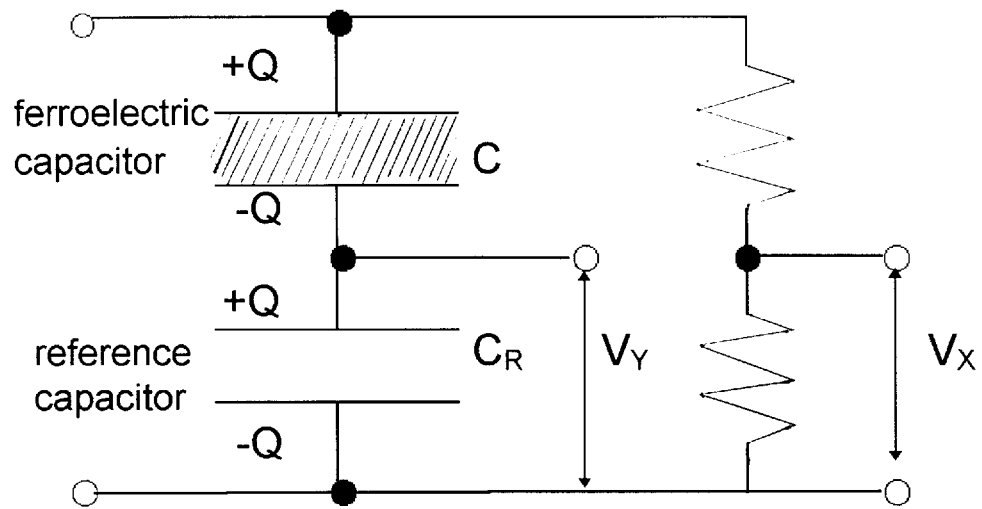
FIG. 5 is a view showing a Sawyer Tower Bridge used for the measurement of ferroelectric properties in Example 1, Comparison Example 1 and Comparison Example 2.

The ferroelectric properties were measured by use of a Sawyer Tower circuit shown in FIG. 5 by applying a voltage to capacitors of a type shown in FIG. 1. The Sawyer Tower circuit shown in FIG. 5 is utilized by being connected to a measurement apparatus such as an oscilloscope for displaying. In the measurement of Example 1, a voltage $V_X$ obtained by dividing the voltage V applied to the thin ferroelectric element is inputted into the terminal for the axis of abscissas of the oscilloscope. Assuming the polarization surface charge density of the thin ferroelectric film to be P and the true charge surface density to be D, when a reference capacitor having a capacitance of $C_R$ is connected as shown in FIG. 5, the value $(P+\epsilon_0 E) \times A$, namely, $D \times A$ (wherein A is an area of the electrode) and the charge $C_R V_X$ stored in the reference capacitor are both equal to Q, so that the voltage $V_Y(D \times A/C_R)$ which is proportional to D is inputted into the terminal for the axis of ordinates of the oscilloscope.

Here, since P is sufficiently larger than E in ferroelectric substances, it can be assumed that D=P. When this $V_Y$–$V_X$ curve is plotted again using the film thickness, the voltage partition ratio, the area (A) of the electrode and the capacitance $C_R$ of the reference capacitor which are known values, a P-E (residual spontaneous polarization-electric field) hysteresis curve or a D-E (stored electric charge-electric field) hysteresis curve is obtained. From these curves, it is possible to read the residual spontaneous polarization (Pr), the coercive field (Ec) and the stored electric charge (ΔQ).

Figure 6:
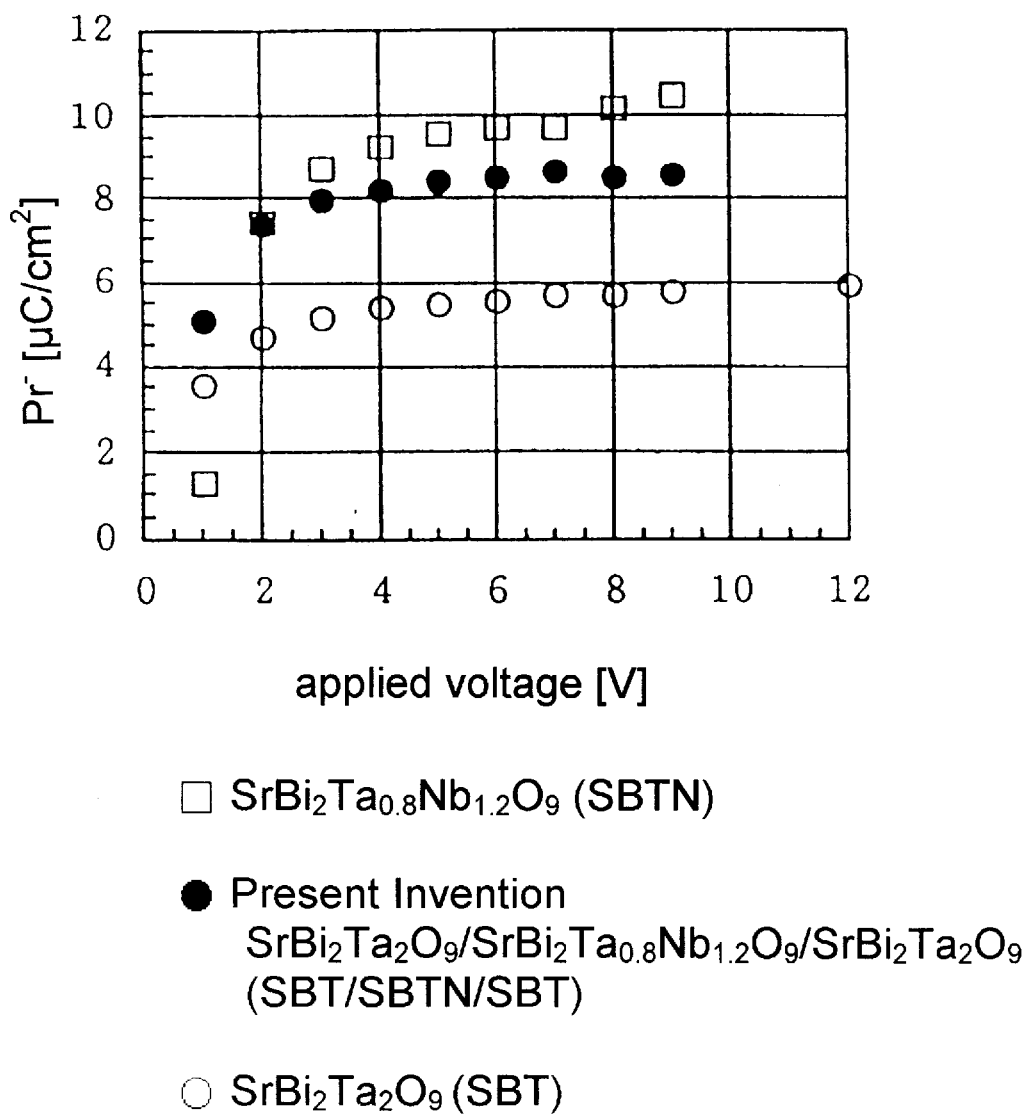
FIG. 6 is a view showing how the residual spontaneous polarization Pr depends on the applied voltage in Example 1, Comparison Example 1 and Comparison Example 2.
Figure 7:
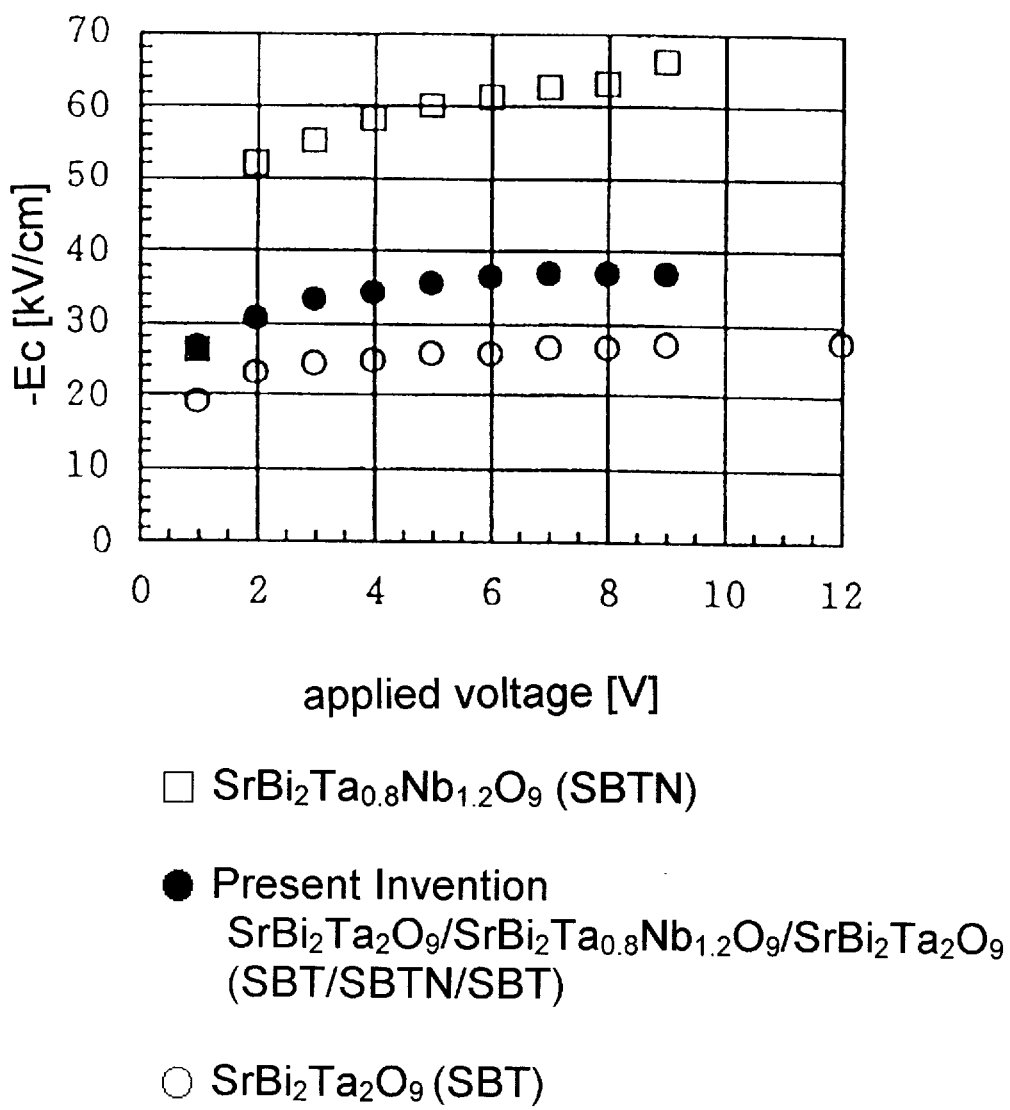
FIG. 7 is a view showing how the coercive field Ec depends on the applied voltage in Example 1, Comparison Example 1 and Comparison Example 2.
Figure 8:
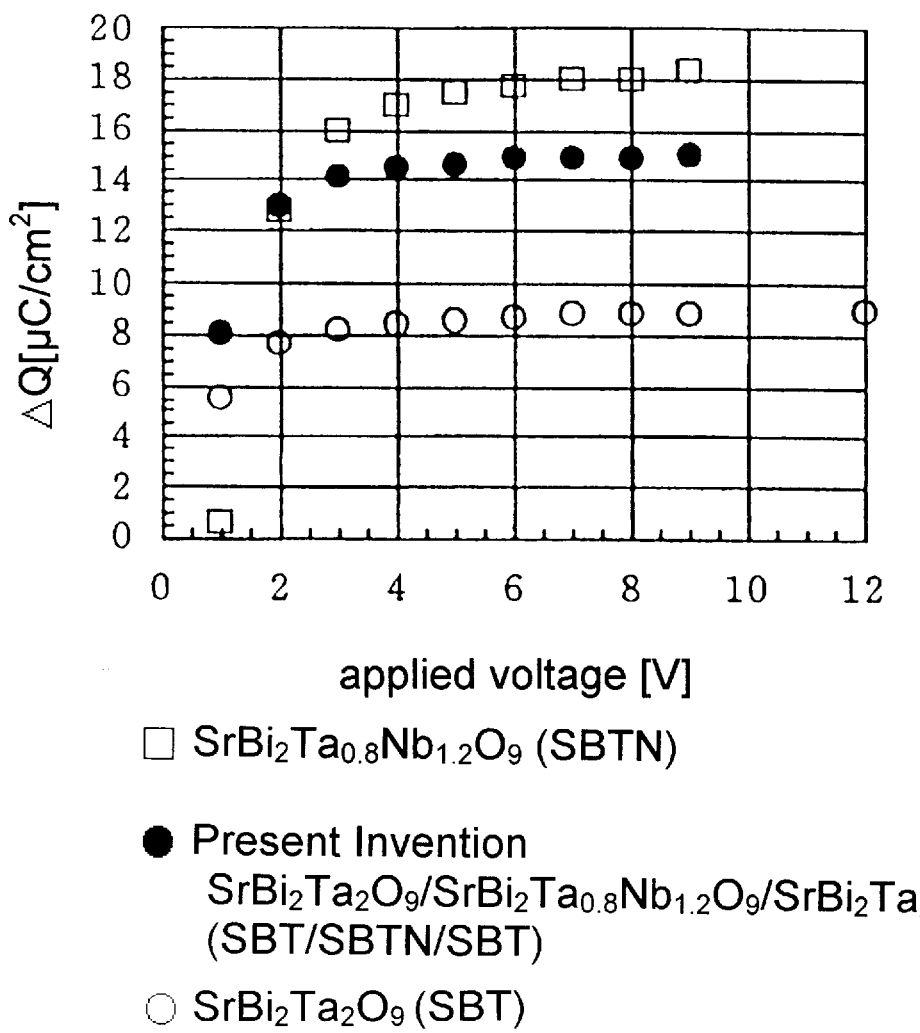
FIG. 8 is a view showing how the switching electric charge ΔQ depends on the applied voltage in Example 1, Comparison Example 1 and Comparison Example 2.

FIGS. 6, 7 and 8 show the results obtained by measuring the ferroelectric properties as the applied voltage is varied from 1 to 12 V in the thin ferroelectric film elements of Example 1 and the Comparison Examples 1 and 2 by employing the Sawyer Tower method. Referring to FIGS. 6, 7 and 8, the symbol ● represents the Example 1 (the laminated thin ferroelectric film of SBT/SBTN/SBT), the symbol ○ represents the Comparison Example 1 (the thin ferroelectric film of single SBT layer), and the symbol □ represents the Comparison Example 2 (the thin ferroelectric film of single SBTN layer).

FIG. 6 is a view showing how the residual spontaneous polarization Pr depends on the applied voltage in Example 1, Comparison Example 1 and Comparison Example 2. FIG. 6 shows that Example 1 of the present invention has a residual spontaneous polarization Pr which is about 1.7 times larger (when a voltage of 3 V is applied) than that of Comparison Example 1 (the thin ferroelectric film of single SBT layer) and is extremely advantageous in reading out the memory when the thin ferroelectric film is used as a memory element. Further, the Example 1 of the present invention shows a saturation property of Pr similar to that of Comparison Example 1, namely, an excellent saturation property of the value Pr relative to the variation in the applied voltage, although the residual spontaneous polarization Pr is inferior to that of Comparison Example 2 including $SrBi_2Ta_{0.8}Nb_{1.2}O_9$ obtained by adding Nb into $SrBi_2Ta_2O_9$. From these, it is understood that the laminated thin ferroelectric film of SBT layer/SBTN layer/SBT layer according to Example 1 of the present invention has both the excellent Pr saturation property of SBT and the high residual spontaneous polarization Pr of SBTN.

FIG. 7 is a view showing how the coercive field Ec depends on the applied voltage in Example 1, Comparison Example 1 and Comparison Example 2. FIG. 7 shows that Example 1 according to the present invention has a sufficiently small coercive field Ec which is not so different from that of Comparison Example 1 (the thin ferroelectric film of single SBT layer), whereas the Comparison Example 2 including $SrBi_2Ta_{0.8}Nb_{1.2}O_9$ obtained by adding Nb into $SrBi_2Ta_2O_9$ shows a large coercive field Ec. Further, the Example 1 according to the present invention shows a saturation property of Ec similar to that of Comparison Example 1 (the thin ferroelectric film of single SBT layer), namely, an excellent saturation property of the value Ec relative to the variation in the applied voltage, although the coercive field Ec is a little inferior to that of Comparison Example 1.

FIG. 8 is a view showing how the switching electric charge ΔQ depends on the applied voltage in Example 1, Comparison Example 1 and Comparison Example 2. FIG. 8 shows the same tendency as the dependence of the residual spontaneous polarization Pr on the applied voltage shown in FIG. 6. In other words, the laminated thin ferroelectric film of SBT layer/SBTN layer/SBT layer according to Example 1 of the present invention has both the excellent ΔQ saturation property of SBT relative to the applied voltage and the high switching electric charge ΔQ of SBTN.

It seems that the above-mentioned good properties of Example 1 have been obtained by forming a laminated structure of a plurality of layers including a ferroelectric material having approximately the same crystal structure so as to grow crystals without deteriorating the characteristics such as residual spontaneous polarization.

The fatigue characteristics of Example 1 and Comparison Examples 1 and 2.

Figure 9:
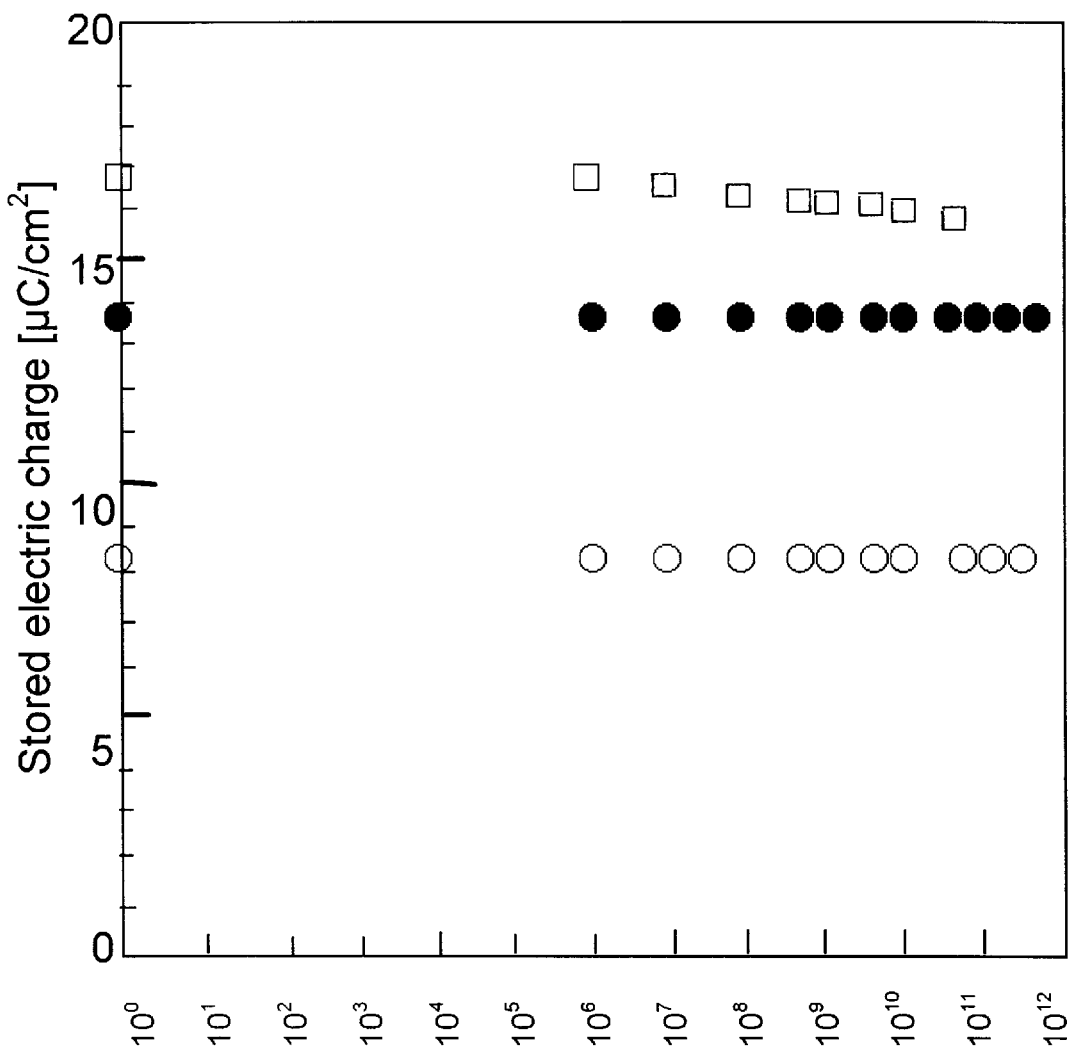
FIG. 9 is a view showing the fatigue characteristics in Example 1, Comparison Example 1 and Comparison Example 2.

FIG. 9 is a view showing the measurement of the variation in the stored electric charge relative to the repetition times when a voltage of 3 V is applied. Referring to FIG. 9, the symbol ● represents the Example 1 (the laminated thin ferroelectric film of SBT/SBTN/SBT), the symbol ○ represents the Comparison Example 1 (the thin ferroelectric film of single SBT layer), and the symbol □ represents the Comparison Example 2 (the thin ferroelectric film of single SBTN layer).

When the stored electric charge of each case after $2 \times 10^{11}$ times repetition is compared in FIG. 9, it is understood that the stored electric charges of Example 1 and Comparison Example 1 (the thin ferroelectric film of single SBT layer)

decrease little, whereas the stored electric charge of Comparison Example 2 (the thin ferroelectric film of single SBTN layer) decreases to 90%. Also, the stored electric charge of Example 1 is itself significantly larger than that of Comparison Example 1 although it is a little inferior than that of Comparison Example 2. These show that Example 1 according to the present invention shows little fatigue associated with the polarization inversion while maintaining the high stored electric charge of SBTN.

The leakage current characteristics of Example 1 and Comparison Examples 1 and 2.

Ferroelectric memories have a non-volatile property of storing the memory contents even when the power is turned off. Therefore, when the ferroelectric memories are applied to NVDRAMs which operate like DRAMs in an ordinary operation, the large leakage current causes problems such as a decrease in refreshing time. On the other hand, if the leakage current can be decreased by some orders of magnitude while maintaining the stored electric charge to be constant, the refreshing time can be elongated, thereby greatly improving the memory device characteristics. Also, if the leakage current is large, the electric field applied to the thin ferroelectric film will be small, causing problems such as insufficient polarization inversion. From these viewpoints, the leakage current should preferably be as small as possible.

Table 1 shows the results of measuring the variation in the leakage current densities together with the resistivities thereof in the thin ferroelectric film element of Example 1 and the thin ferroelectric film elements of Comparison Examples 1 and 2 when a voltage of 3 V is applied.

TABLE 1

|  | Leakage current (A/cm$^2$) | 3V applied Resistivity (Ω cm) |
|---|---|---|
| Embodiment 1 | 4.56 × 10$^{-9}$ | 3.3 × 10$^{13}$ |
| Comparison Example 1 | 3.95 × 10$^{-9}$ | 3.8 × 10$^{13}$ |
| Comparison Example 2 | 6.79 × 10$^{-7}$ | 2.2 × 10$^{11}$ |

When Example 1 according to the present invention is compared with Comparison Examples 1 and 2, it is understood that Example 1 provides a resistivity which is of the same orders of magnitude as Comparison Example 1 and is higher by two orders of magnitude than Comparison Example 2. Also, the leakage current of Example 1 is of the same orders of magnitude as Comparison Example 1and is lower by two orders of magnitude than Comparison Example 2. These show that Example 1 has a leakage current lower by two orders of magnitude than SBTN while maintaining the high residual spontaneous polarization of SBTN by inserting the SBTN layer having the lower resistivity between the SBT layers having the higher resistivity. Since the ferroelectric layer having a high resistivity provides an effect of shutting the leakage current off, it seems that the leakage current in the thin ferroelectric film according to Example 1 of the present invention has become as small as the leakage current of the ferroelectric layer having the higher resistivity by inserting the ferroelectric film having the lower resistivity between the ferroelectric layers having the higher resistivity. In other words, it is possible to improve the leakage current properties without deteriorating the ferroelectric properties by using a ferroelectric layer having a high resistivity as shown in Example 1 of the present invention instead of using an ordinary dielectric layer having a high resistivity.

From the above-mentioned results, it has been found out that it is possible to achieve a thin ferroelectric film element with low coercive field Ec and low leakage current and with little fatigue while maintaining the high residual spontaneous polarization Pr and the high switching electric charge ΔQ of SBTN by adopting a laminated thin ferroelectric film of SBT layer/SBTN layer/SBT layer in the thin ferroelectric film element according to Example 1 of the present invention.

Examples 2 to 6

Five kinds of thin ferroelectric film elements were fabricated by changing the lamination pattern of SBT layers and SBTN layers used in Example 1, namely, by exchanging these layers and also varying the number of these layers to be laminated. The physical properties of the obtained five thin ferroelectric film elements were measured.

These elements were fabricated by merely changing the order of steps similar to those of Example 1 for applying the precursor solutions (a) and for applying the precursor solution (b) or by changing the number of steps to be performed. The other conditions for forming the film was the same as those of Example 1. Also, the structures of these elements were the same as those of Example 1 except that the order of the SBT layers and the SBTN layers to be laminated was changed.

Figure 10A:
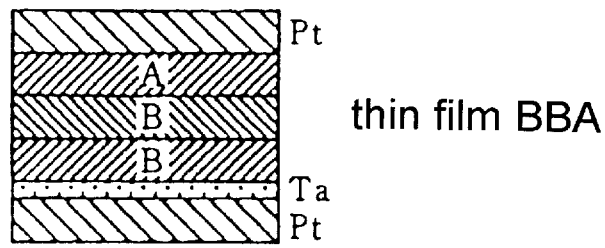
FIGS. 10(a) to 10(h) are conceptual views showing film structures of thin ferroelectric film elements according to Examples 2 to 6 of the present invention.
Figure 10B:
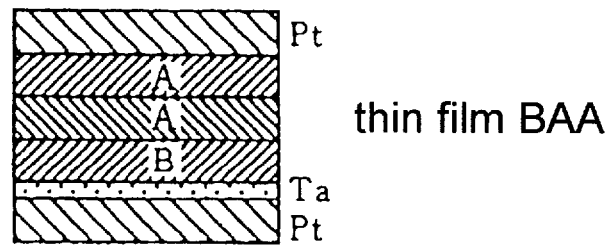
Figure 10C:
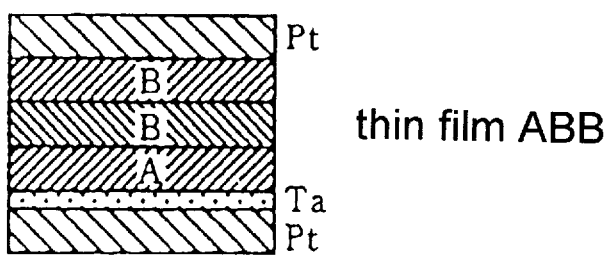
Figure 10D:
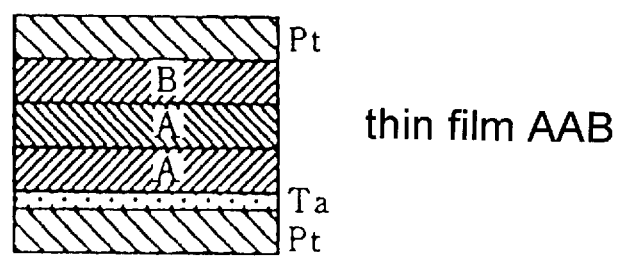
Figure 10E:
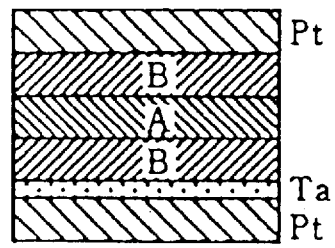
Figure 10F:
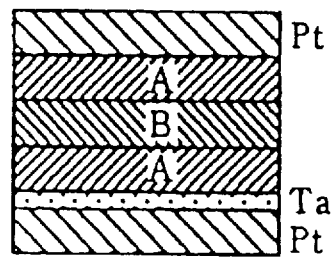
Figure 10G:
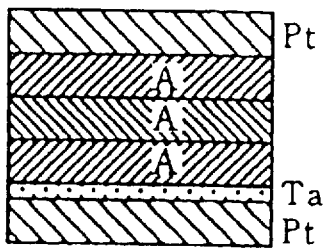
Figure 10H:
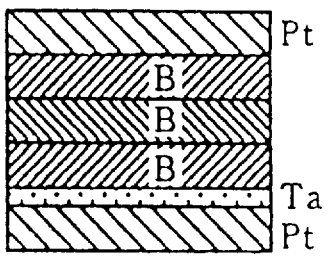

FIGS. 10(a) to 10(e) show the film structures of Examples 2 to 6. In addition to these thin ferroelectric elements, FIGS. 10(f), 10(g) and 10(h) show the film structures of the thin ferroelectric film elements of Example 1, Comparison Example 1, and Comparison Example 2, respectively. Referring to FIGS. 10(a) to 10(h), the layer (A) represents a SrBi$_2$Ta$_2$O$_9$ layer (SBT layer) and the layer (B) represents a SrBi$_2$Ta$_{0.8}$Nb$_{1.2}$O$_9$ layer (SBTN layer). The substrate is omitted in the drawings.

Table 2 shows the results of measuring the residual polarization Pr, the coercive field Ec, the switching electric charge δQ, and the leakage current density I$_L$ in these eight thin ferroelectric film elements. In Table 2, the measuring units are: μC/cm$^2$ for the residual polarization Pr, kV/cm for the coercive field Ec, μC/cm$^2$ for the switching electric charge δQ, and A/cm$^2$ for the leakage current density I$_L$.

TABLE 2

|  | Residual Polarization [Pr] | Coercive field [Ec] | Switching electric charge [δ Q] | Leakage current density [I$_L$] |
|---|---|---|---|---|
| Example 1f [thin film ABA] | 6.96 | 34.5 | 12 | 1.28 × 10$^{-8}$ |
| Example 2a [thin film BBA] | 7.75 | 44 | 14 | 9.64 × 10$^{-8}$ |
| Example 3c [thin film ABB] | 6.55 | 46.1 | 12 | 9.26 × 10$^{-9}$ |
| Example 4d [thin film AAB] | 6.13 | 36.4 | 10.5 | 1.37 × 10$^{-8}$ |
| Example 5e [thin film BAB] | 8.62 | 43.2 | 15.7 | 9.57 × 10$^{-8}$ |
| Example 6b [thin film BAA] | 8.18 | 28.9 | 14.1 | 3.45 × 10$^{-8}$ |
| Comparison Example 1g [thin film AAA] | 5.1 | 24.5 | 8.3 | 3.95 × 10$^{-9}$ |
| Comparison Example 2h [thin film BBB] | 8.7 | 55.1 | 16.0 | 6.79 × 10$^{-7}$ |

Table 2 shows that the structures with an SBTN layer at a position nearest to the lower electrode (thin films BBA, BAA, BAB, BBB) provide a large residual polarization Pr. When these are compared with the structures having an SBT layer at a position nearest to the lower electrode (thin films ABB, ABA, AAB, AAA), it is understood that these structures have approximately the same residual polarization Pr irrespective of the number of SBTN layers except for the case of the thin film AAA having no SBTN layer. Therefore, it has been found out that, in case of the thin films having an SBTN layer, the number of SBTN layers has little influence on the residual polarization Pr.

On the other hand, the coercive field Ec tends to increase as the number of SBTN layers increase. The leakage current $I_L$ is as small as about $10^{-9}$ to $10^{-8}$ except for the case of the thin film BBB.

From the result of measuring these properties in the Examples, it was found out that the film having the most excellent ferroelectric property was the thin film BAA which showed high Pr and low Ec, and the film having the most inferior ferroelectric property was the thin film ABB which showed low Pr and high Ec. From these, it is understood that the residual polarization Pr, the switching electric charge δQ and the leakage current density $I_L$ do not depend so much on the number of SBTN layers, but the properties depend on which of the SBTN layer and the SBT layer is disposed at a position nearest to the lower electrode. Especially, it has been found out that good ferroelectric properties are obtained in the thin ferroelectric film element in which the SBTN layer is disposed at a position nearest to the lower electrode.

Also, good results similar to the above were observed when the fatigue property was measured in the thin ferroelectric film element having the thin film BAA in the same manner as in Example 1. Accordingly, it has been found out that it is possible to improve the fatigue property while maintaining the high ferroelectric property by forming a laminated structure instead of forming a thin ferroelectric film of single SBTN layer.

Example 7

A thin ferroelectric element having a laminated structure of SBT/$Bi_4Ti_3O_{12}$ (hereafter referred to as "BTO")/SBT was formed instead of the thin ferroelectric element having a laminated structure of SBT/SBTN/SBT according to the above Example 1, and the various properties thereof were measured.

The element was fabricated by employing a sol-gel method in the same manner as in the above Examples, using octylic acid solution of Sr, Bi and Ti or octylic acid solution of Bi and Ti as a starting material for the precursor solutions, and dispersing the octylic acid solution into xylene for mixing so that the ratio of Sr/Bi/Ti will be 1/4/4 for the SBT layer and the ratio of Bi/Ti will be 4/3 for the BTO layer. The concentration and the viscosity of the solvent were adjusted to produce the precursor solutions, which were then applied onto a substrate by spin coating method.

Specifically, the precursor solution for the first SBT layer was first applied on the substrate at 5000 rpm for 20 seconds by spin coating method, and the substrate was baked in an oven at 115° C. for 15 minutes in a drying step. A provisional annealing step was then conducted at 400° C. for 60 minutes. The second BTO layer and the third SBT layer were formed in the same manner as in the above process. Subsequently, a main annealing step was conducted in an oxygen atmosphere at 650° C. for 15 seconds by RTA method to form the laminated thin ferroelectric film of SBT layer/BTO layer/SBT layer. An upper electrode was formed on the laminated thin ferroelectric film thus formed in the same manner as in the above Example 1 to complete the thin ferroelectric film element according to this Example.

Comparison Example 3

A thin ferroelectric film element having a thin ferroelectric film of single BTO layer was fabricated in the same manner as in Comparison Example 1.

The result of Example 7 and Comparison Example 3

Table 3 shows the results of measuring the residual polarization Pr, the coercive field Ec, the leakage current and the resistivity in the thin ferroelectric film elements of Example 7 (laminated thin ferroelectric film of SBT layer/BTO layer/SBT layer), Comparison Example 1 (thin ferroelectric film of single SBT layer) and Comparison Example 3 (thin ferroelectric film of single BTO layer), in the same manner as in the above Examples.

TABLE 3

|  | Pr ($\mu C/cm^2$) | Ec (kV/cm) | Leakage current ($A/cm^2$) | Resistivity ($\Omega$ cm) |
| --- | --- | --- | --- | --- |
| Embodiment 7 | 8.6 | 103 | $7.89 \times 10^{-8}$ | $1.9 \times 10^{12}$ |
| Comparison Example 1 | 4 | 92 | $6.85 \times 10^{-8}$ | $2.2 \times 10^{12}$ |
| Comparison Example 3 | 11.6 | 111 | $5.37 \times 10^{-6}$ | $2.8 \times 10^{10}$ |

Table 3 shows that the residual polarization Pr according to Example 7 is two times as large as that of Comparison Example 1. The above-mentioned good property of Example 7 has been obtained by forming, as in the above-described Examples, a laminated structure of a plurality of thin ferroelectric films including a SBT ferroelectric layer having approximately the same crystal structure so as to grow crystals without deteriorating the characteristics such as residual polarization.

Moreover, in Comparison Example 3 (single BTO layer), the leakage current is large and the resistivity is small. In Comparison Example 1 (single SBT layer), the leakage current is smaller by two orders of magnitude and the resistivity is larger by two orders of magnitude, thus showing good values. On the other hand, Example 7 according to the present invention shows a leakage current which is smaller by two orders of magnitude than that of Comparison Example 3 while maintaining the high residual polarization Pr of BTO.

Since the ferroelectric layer having a high resistivity provides an effect of shutting the leakage current off, it seems that the leakage current in the thin ferroelectric film according to Example 7 of the present invention has become as small as the leakage current of the ferroelectric layer having the higher resistivity by inserting the ferroelectric film having the lower resistivity between the ferroelectric layers having the higher resistivity, as in the above Example 1. In other words, it is possible to improve the leakage current properties with little deterioration in the ferroelectric properties by using a ferroelectric layer having a high resistivity as shown in Example 7 of the present invention instead of using an ordinary dielectric layer having a high resistivity.

Example 8

The thin ferroelectric film fabricated according to Example 1 of the present invention was applied to a nonvolatile memory having a capacitor structure.

Figure 11:
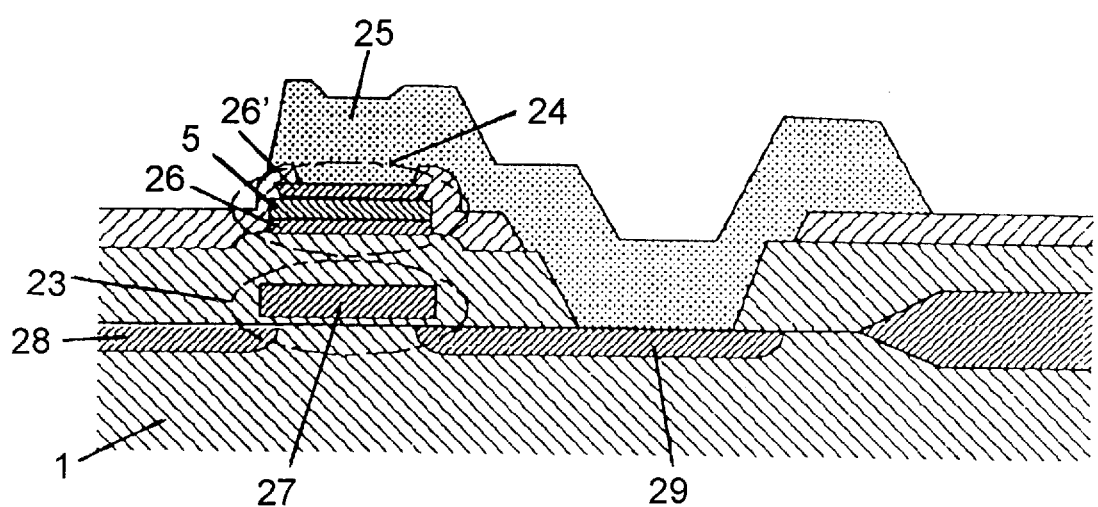
FIG. 11 is a schematic view showing an essential part of a non-volatile memory having a capacitor structure according to Example 8 of the present invention.

FIG. 11 is a schematic view showing an essential part of a non-volatile memory having a capacitor structure according to Example 8 of the present invention. Referring to FIG. 11, the non-volatile memory comprises memory cells and each of the memory cells includes a capacitor 24 and a transistor 23. The capacitor 24 has a structure such that the laminated thin ferroelectric film 5 fabricated according to the present invention is interposed between a pair of electrodes (conductors) 26 and 26'. The transistor 23 includes a bit line 28, a word line 27 and a signal line 29 connected to an Al electrode 25. The Al electrode 25 is also connected to the electrode 26' of the capacitor 24.

Next, the method for fabricating the non-volatile memory according to Example 1 of the present invention will be explained. First, $SiO_2$ and $Si_3N_4$ are formed on an n-type silicon substrate. Field oxidation is then performed by photoetching to form a field $SiO_2$, leaving the $Si_3N_4$ at a portion where a transistor is to be formed later. Subsequently, the previously formed $Si_3N_4$ film and the $SiO_2$ film immediately thereunder are removed. Then, after a gate $SiO_2$ is formed with a gate oxide film, a polysilicon gate 27 is formed. By using the gate 27 as a mask, ion implantation is carried out to form a source 28 and a drain 29. The surface is then covered with PSG (Phospho-Silicate Glass), followed by reflowing to planarize the surface. Then, after an electrode 26 is formed thereon, a laminated thin ferroelectric film 5 is formed on the electrode 26 in the same manner as in the above-described Example 1, and an electrode 26' is formed thereon. Subsequently, the surface is covered with PSG again, followed by reflowing to planarize the surface. A contact hole is then formed on the electrode 26' and on the drain 29 by etching. Finally, an Al electrode 25 is formed for wiring.

Figure 12:
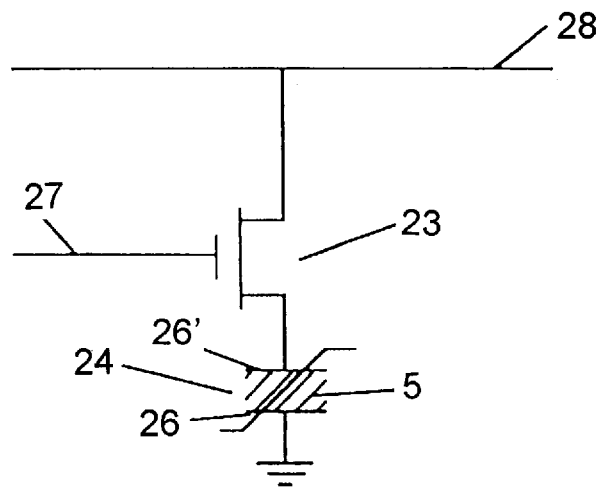
FIG. 12 is a view showing an equivalent circuit of the non-volatile memory of FIG. 11.

Next, the operation of the non-volatile memory having a capacitor structure according to this Example of the present invention will be explained by referring to FIG. 12 which shows an equivalent circuit thereof. For writing "1" into the memory, a negative pulse larger than the coercive field of the laminated thin ferroelectric film 5 is applied to the film 5 from the bit line 28 via the transistor 23 so as to generate dielectric polarization in the laminated thin ferroelectric film 5, thereby storing negative residual polarization charge in the electrode 26 of the capacitor 24 for writing. For writing "0" into the memory, a positive pulse larger than the coercive field is applied to the laminated thin ferroelectric film 5 from the bit line 28 via the transistor 23 so as to generate dielectric polarization in the laminated thin ferroelectric film 5, thereby storing positive residual polarization charge in the electrode 26 of the capacitor 24 for writing.

For reading "1" out of the memory, a positive pulse is applied, whereby polarization inversion takes place to store positive residual polarization charge in the electrode 26 of the capacitor 24 instead of the previous negative residual polarization charge. This causes a change in the amount of stored electric charge, the change being equal to the difference between the negative residual polarization charge before the application of the pulse and the positive residual polarization charge after the application of the pulse, making it possible to read "1" out of the memory. On the other hand, for reading "0" out of the memory, a positive pulse is applied, whereby no polarization inversion takes place, causing little change in the amount of stored electric charge before and after the application of the pulse, making it possible to read "0" out of the memory. In practice, the reading may be conducted by sensing the difference in the amount of stored electric charge before and after the application of the pulse with a sensing amplifier or the like connected to the bit line to identify the difference as bit information. Since the laminated thin ferroelectric film 5 has residual polarization, the state of "1" or "0" is maintained even after the power is turned off, thereby realizing the non-volatile memory operation.

Here, the memory having a similar capacitor structure can be operated as a DRAM by utilizing only the high dielectric property of the ferroelectric substance. In this case, the memory can be operated as a non-volatile memory only when the power is off.

Example 9

By use of FIG. 13, an explanation will be given on a case in which the thin ferroelectric film according to Example 1 of the present invention is applied to a MFMIS-FET (Metal Ferroelectric Metal Insulator Semiconductor FET).

Figure 13:
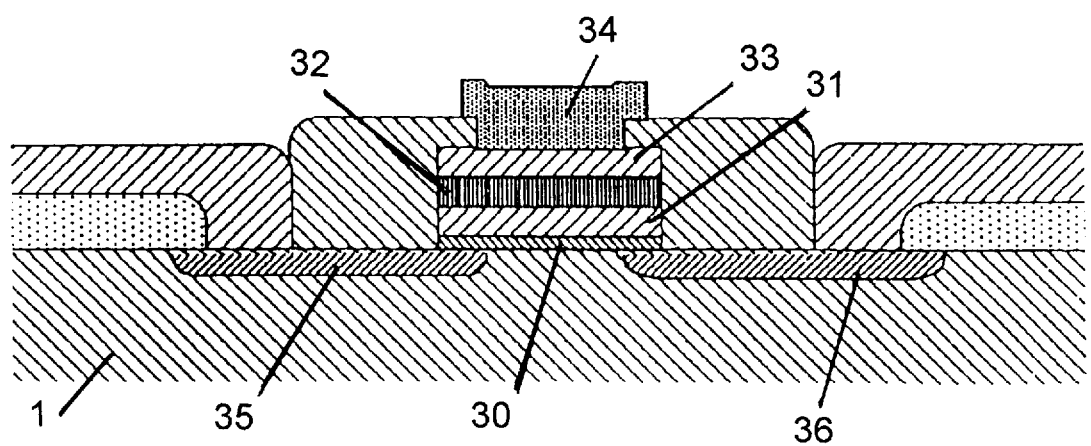
FIG. 13 is a schematic view showing an essential part of MFMIS-FET according to Example 9 of the present invention.

FIG. 13 is a schematic view showing an essential part of MFMIS-FET. Referring to FIG. 13, the element includes, on an n-type silicon substrate surface 1, a drain region 35 and a source region 36, on which are formed a $SiO_2$ film (gate insulating film) 30, a floating gate 31, a laminated thin ferroelectric film 32, a control gate 33 and a wiring 34, successively in this order.

The method for manufacturing the element according to Example 9 will be explained. First, as in Example 8, a gate insulating film ($SiO_2$) 30 is formed on an n-type silicon substrate 1. After a floating gate 31 is formed thereon with Pt, a drain 35 and a source 36 are formed by ion implantation. The surface is then covered with PSG (Phospho-Silicate Glass), followed by reflowing to planarize the surface. Subsequently, the PSG on the floating gate 31 by Pt is removed by etching and a laminated thin ferroelectric film 32 is formed on the floating gate 31 as in Example 1. Further, a control gate 33 is formed thereon with Pt. The surface is then covered with PSG again, followed by reflowing to planarize the surface. A contact hole is then formed on the control gate 33, the drain 35, and the source 36 by etching. Finally, an Al wiring 34 is formed.

Next, the operation of the MFMIS-FET according to Example 9 will be explained. In the MFMIS-FET, a voltage is applied to the control gate 33 so as to change the polarization direction of the laminated thin ferroelectric film 32, whose electrostatic induction causes dielectric polarization to change in the gate insulating film 30 ($SiO_2$ film) via the floating gate 31. The direction of the dielectric polarization controls the formation of channel regions in the substrate surface immediately under the floating gate. This allows determination of the values "1" and "0" by ON-OFF of the drain current.

Suppose, for example, that the control gate 33 is in a state of zero bias, if the laminated thin ferroelectric film 32 is polarized towards the semiconductor substrate (the silicon substrate 1) to allow the floating gate 31 side of the laminated thin ferroelectric film 32 to have a negative polarity, the $SiO_2$ film 30 will be dielectrically polarized to allow the surface of the $SiO_2$ film 30 contacting the Si substrate 1 to have a negative polarity, whereby the surface of the Si substrate 1 contacting the $SiO_2$ film 30 will have a positive polarity, thus electrically disconnecting the drain 35 and the source 36 (the OFF state).

Next, when a positive voltage larger than the coercive field of the laminated thin ferroelectric film 32 is applied to the control gate 31, the polarization of the laminated thin ferroelectric film 32 will be reversed so that the floating gate 31 side of the laminated thin ferroelectric film 32 will have a positive polarity. In this case, the $SiO_2$ film 30 will be dielectrically polarized to allow the surface of the SiO$_2$ film 30 contacting the Si substrate 1 to have a positive polarity, whereby the surface of the Si substrate 1 contacting the SiO$_2$ film 30 will have a negative polarity, thus electrically connecting the drain 35 and the source 36 (the ON state).

When the control gate 31 is allowed to have a voltage of zero bias in this state (the ON state), the residual polarization of the laminated thin ferroelectric film 32 will keep this state unchanged. At this state, since the dielectric polarization of the SiO$_2$ film 30 is kept unchanged as long as the polarization of the laminated thin ferroelectric film 32 is maintained, the MFMIS-FET can be operated as a non-volatile memory from which data can be non-destructively read out.

According to the thin ferroelectric film element of the present invention thus described, it is possible to manufacture an element which can achieve sufficiently high spontaneous residual polarization and sufficiently low coercive field with a lower annealing temperature than by the conventional methods and in which the operating voltage is small, the leakage current is small, and the fatigue characteristics are excellent.

More specifically described, although the residual polarization of SrBi$_2$Ta$_{0.8}$Nb$_{1.2}$O$_9$ (SBTN) is 1.7 times larger than that of SrBi$_2$Ta$_2$O$_9$ (SBT), the coercive field and the leakage current were large and hence had to be largely improved. However, as shown in the above embodiments of the present invention, it is possible to largely improve the coercive field and the leakage current density, while substantially maintaining the high residual polarization and the switching electric charge of SBTN, by providing a laminated structure of SrBi$_2$Ta$_{0.8}$Nb$_{1.2}$O$_9$ (SBTN) which is a low resistance layer and SrBi$_2$Ta$_2$O$_9$ (SBT) which is a high resistance layer. This leads to a great advantage in reading out the memory when the thin ferroelectric film is furnished in an electronic device.

Also, by providing a laminated structure of SBTN and SBT, the coercive field of the thin ferroelectric film according to the present invention can be reduced to be as small as about 50% of the coercive field of SBTN and will have a good saturation property relative to the applied voltage in which the coercive field is saturated at about 3V, while substantially maintaining the high residual polarization of SBTN. This will be effective in reducing the operation voltage when the thin ferroelectric film is furnished in an electronic device.

Also, by providing a laminated structure of SBTN and SBT, the leakage current density of the thin ferroelectric film according to the present invention can be reduced by two orders of magnitude compared with the leakage current density of SBTN, while substantially maintaining the high residual polarization of SBTN. This will elongate the period of time required for refreshing when the memory is operated as a DRAM. Further, if the memory is operated as a FRAM, sufficient voltage will be applied to the thin ferroelectric film to ensure sufficient polarization inversion, thereby improving the stability and the reliability of the operation.

Moreover, while the switching electric charge decreased to about 90% of the original amount after $2 \times 10^{11}$ times repetition of the polarization inversion in a single SBTN layer, there will be little deterioration in the fatigue property of the thin ferroelectric film according to the present invention by providing a laminated structure of SBTN and SBT, thereby greatly reducing the fatigue accompanying the repetition of the polarization inversion.

Further, not only the laminated structure of SBTN and SBT but also a laminated structure of SBT (SrBi$_2$Ta$_2$O$_9$) and Bi$_4$Ti$_3$O$_{12}$ or the like structure can achieve a similar improvement in these characteristics.

What we claim is:

1. A thin ferroelectric film element comprising upper and lower thin electrode films and a thin ferroelectric film formed on a substrate, wherein the thin ferroelectric film comprises at least three ferroelectric layers in which (1) at least one layer has a composition of constituent elements different from at least two other layers and a resistivity higher than that of at least two other layers; and (2) at least two of the other layers have the same composition of constituent elements.

2. The thin ferroelectric film element according to claim 1, wherein at least one layer of the thin ferroelectric film comprises a bismuth layered-structure compound material.

3. The thin ferroelectric film element according to claim 2, wherein each of the at least three layers of the thin ferroelectric film contains at least one metal element selected from a group consisting of Sr, Bi, Ti, Ta and Nb.

4. The thin ferroelectric film element according to claim 1, wherein the at least one layer having a resistivity higher than that of at least two other layers has a resistivity of more than $10^{12}$ $\Omega$.cm.

5. The thin ferroelectric film element according to claim 1, wherein each of the at least three layers of the thin ferroelectric film has the thickness within a range of from 100 Å to 1000 Å.

6. The thin ferroelectric film element according to claim 1, which is used to form a circuit portion of an integrated circuit constituting a semiconductor device.

7. A method of manufacturing a thin ferroelectric film element of claim 1 comprising:

forming a lower thin electrode film on a substrate;

applying each of a plurality of precursor solutions containing partially different metal elements and drying to form a laminate film of at least three layers comprising at least two kinds of films;

performing a first annealing;

forming an upper thin electrode film; and performing a second annealing.

8. The thin ferroelectric film element according to claim 1, wherein each of the at least three layers of the thin ferroelectric film is formed from a member selected from a group consisting of SrBi$_2$Ta$_2$O$_9$, SrBi$_2$Ta$_{0.8}$Nb$_{1.2}$O$_9$, Bi$_4$Ti$_3$O$_{12}$, SrBi$_4$Ti$_4$O$_{15}$, SrBi$_4$(Ti, Zr)$_4$O$_{15}$, SrBi$_2$Nb$_2$O$_9$, CaBi$_2$Ta$_2$O$_9$, BaBi$_2$Ta$_2$O$_9$, BaBi$_2$Nb$_2$O$_9$, and PbBi$_2$Ta$_2$O$_9$.

9. The thin ferroelectric film element according to claim 1, wherein the at least one layer having a resistivity higher than that of at least two other layers has a resistivity within a range of about $10^{13}$ to about $10^{12}$ $\Omega$.cm.

\* \* \* \* \*